United States Patent [19]

Leydier

[11] Patent Number: 4,786,877

[45] Date of Patent: Nov. 22, 1988

[54] AMPLIFIER FOR VOLTAGE OR CURRENT TO FREQUENCY CONVERTER

[75] Inventor: Robert A. Leydier, Mountain View, Calif.

[73] Assignee: Sangamo-Weston Incorporated, Norcross, Ga.

[21] Appl. No.: 66,793

[22] Filed: Jun. 25, 1987

[51] Int. Cl.$^4$ .......................... H03F 1/02; H03F 3/16
[52] U.S. Cl. ....................................... 330/9; 330/277; 330/253
[58] Field of Search ................. 330/9, 51, 124 D, 252, 330/253, 261, 277, 307, 311

[56] References Cited

U.S. PATENT DOCUMENTS

| | | | |
|---|---|---|---|
| 3,818,340 | 6/1974 | Yamaguchi | 324/142 |
| 4,015,140 | 3/1977 | Milkovic | 307/229 |
| 4,066,960 | 1/1978 | Milkovic | 324/142 |
| 4,118,787 | 3/1978 | Arnoux | 364/842 |
| 4,217,546 | 8/1980 | Milkovic | 324/142 |
| 4,291,377 | 9/1981 | Schneider et al. | 364/483 |
| 4,542,354 | 9/1985 | Robinton et al. | 332/11 D |
| 4,560,975 | 12/1985 | Jarva | 330/9 X |

FOREIGN PATENT DOCUMENTS

| | | |
|---|---|---|
| 8500893 | 2/1985 | PCT Int'l Appl. . |
| 8500894 | 2/1985 | PCT Int'l Appl. . |
| 1269906 | 8/1970 | United Kingdom . |

OTHER PUBLICATIONS

Oldham, N. M. et al., "A Power Factor Standard Using Digital Generation"; National Bureau of Standards, Washington, D.C., (1981).

Moore, W. J. M., "A Technique for Calibrating Power Frequency Wattmeters at Very Low Power Factors"; IEE (1974), Transactions on Instrumentation and Measurement, vol. IM23, No. 4.

Goldberg, E. A., "A High-Accuracy Time-Division Multiplier", RCA Review (1952).

Stabrowski, M. M., "Modern Numerical Analysis of Time-Division Multipliers"; IEEE (1979), Transactions on Instrumentation and Measurement, vol. IM28, No. 1.

Miljanic et al., "On the Electronic Three-Phase Active and Reactive Power Measurement"; IEEE (1978), Transactions on Instrumentation and Measurement, vol. IM27, No. 4.

Bergeest, R. et al., "Evaluation of the Response of Time-Division Multipliers to AC and DC Input Signals"; IEE (1975), Transactions on Instrumentation and Measurement, vol. IM24, No. 4.

Tomota, M. et al., "An Electronic Multiplier for Accurate Power Measurements "; IEEE (1968), Transactions on Instrumentation and Measurement, vol. IM17, No. 4.

Allan, R., "Analog Multipliers: Great Design Tools-Becoming Less Expensive"; EDN (1974), Design Features, p. 34.

Landis & Gyr-"Solid State Precision Meter".

Sternberg, S., "An Accurate Electronic Multiplier"; RCA Review (1955).

Friedl, R. et al., "Electronic Three-Phase Four-Wire Power-Frequency Converter With High Accuracy Over a Wide Range of Use". IEEE (1971), Transactions on Instrumentation and Measurements, vol. IM20, No. 4.

Ryerson, H. R., "Power Measurement by Time-Division Multiplication", Instruments & Control Systems (1963), vol. 36, p. 95.

Primary Examiner—Eugene R. LaRoche
Assistant Examiner—Steven J. Mottola
Attorney, Agent, or Firm—Sanford J. Asman

[57] ABSTRACT

An autozeroing operational amplifier for a voltage or current-to-frequency converter includes a master amplifier and a slave amplifier. The master amplifier uses the voltage across a master capacitor to control the polarization level of an MOS transistor. Changing this level changes the operation of a differential pair connected to a load thereby changing the amplifier's input offset voltage. The slave amplifier, similarly constructed, is connected to periodically refresh the voltage across the master capacitor to compensate for drift and temperature effects.

14 Claims, 10 Drawing Sheets

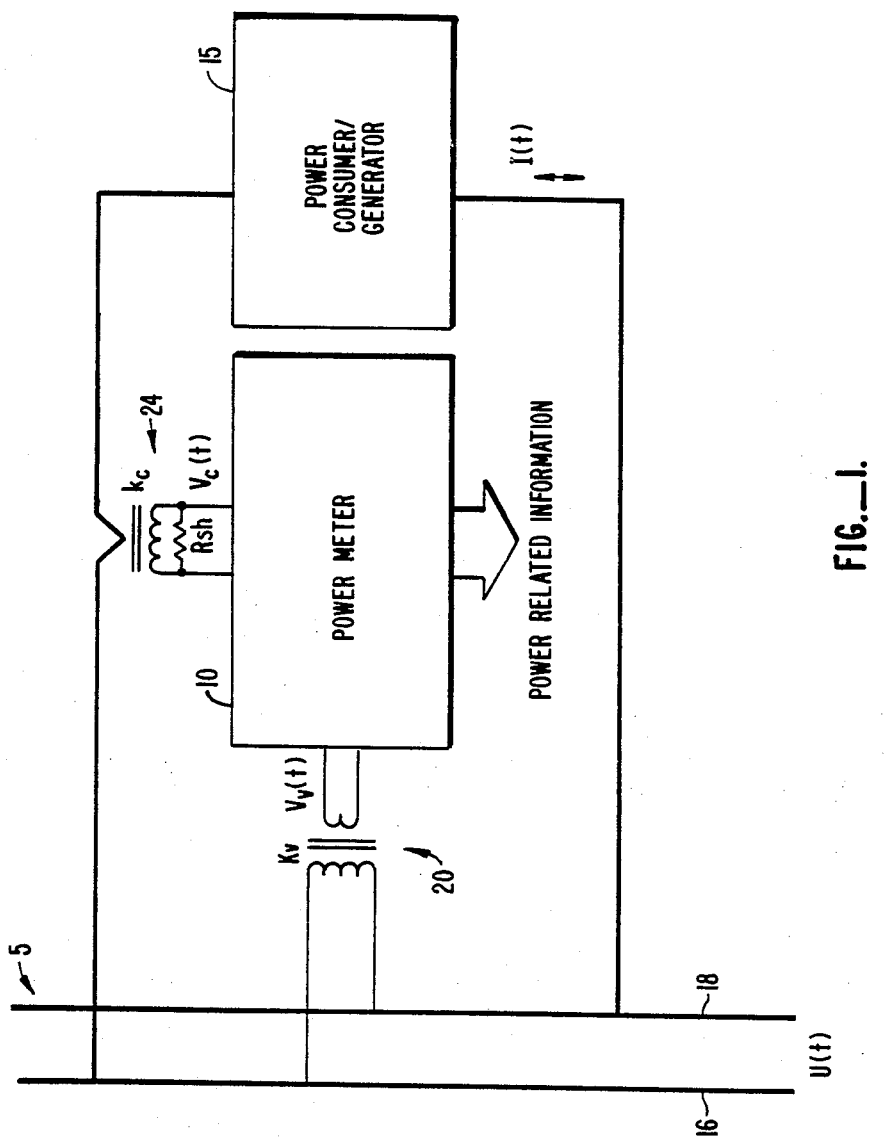
FIG._1.

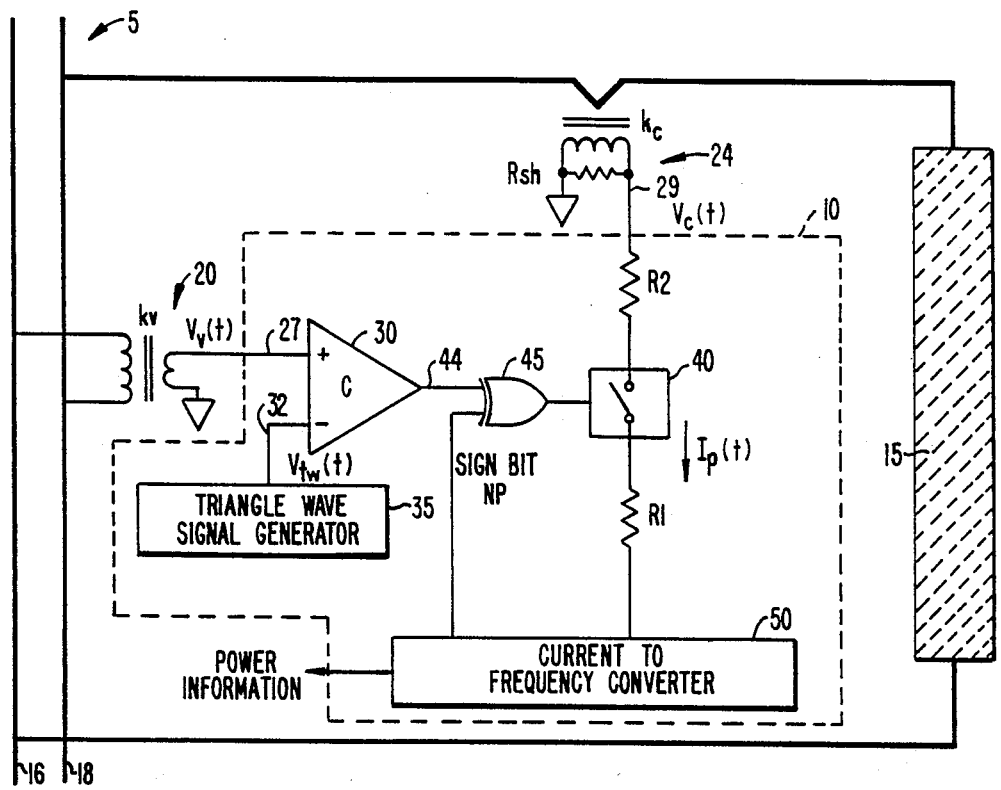
FIG._2.
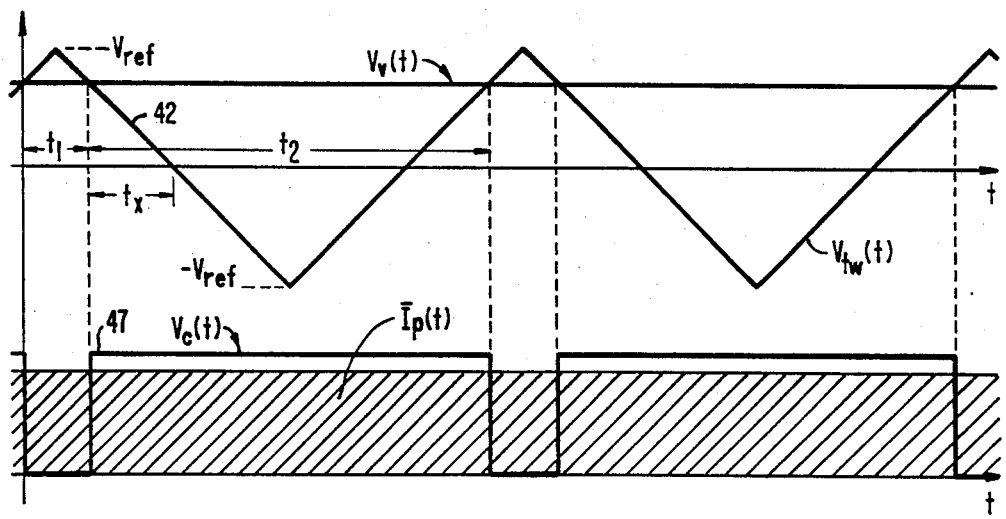
FIG._3.

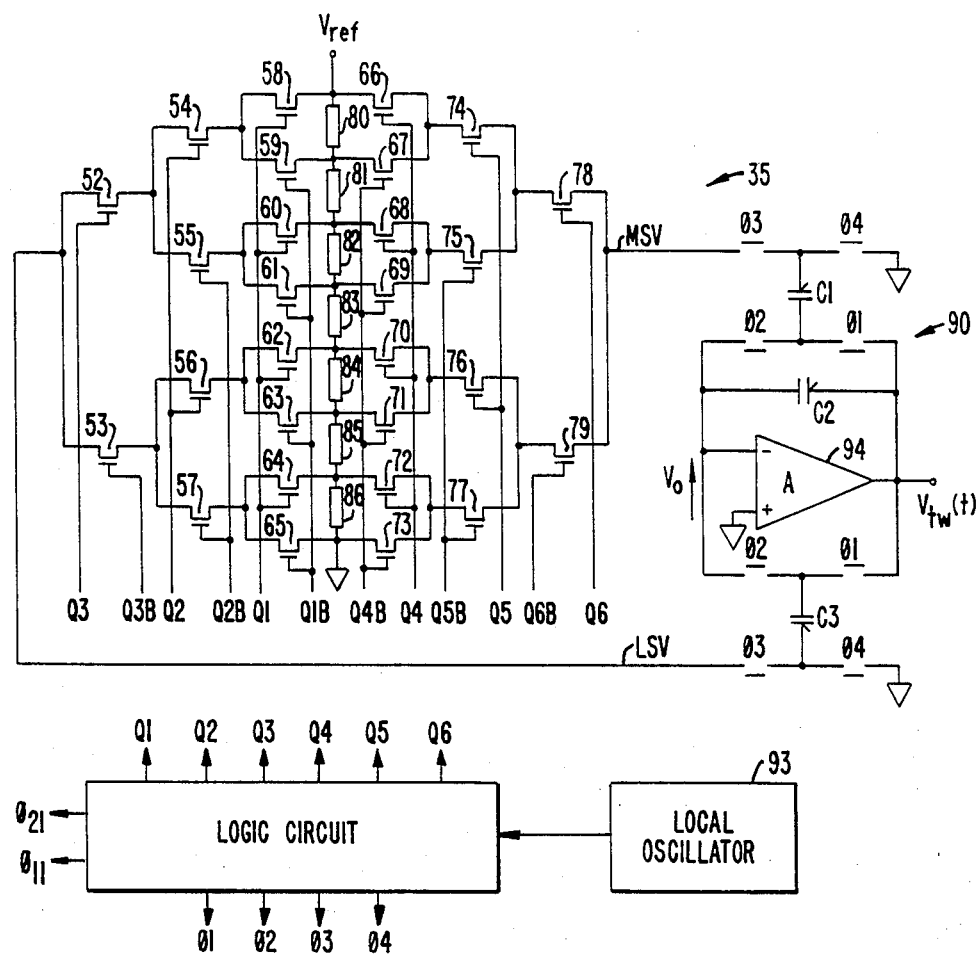
FIG._4.

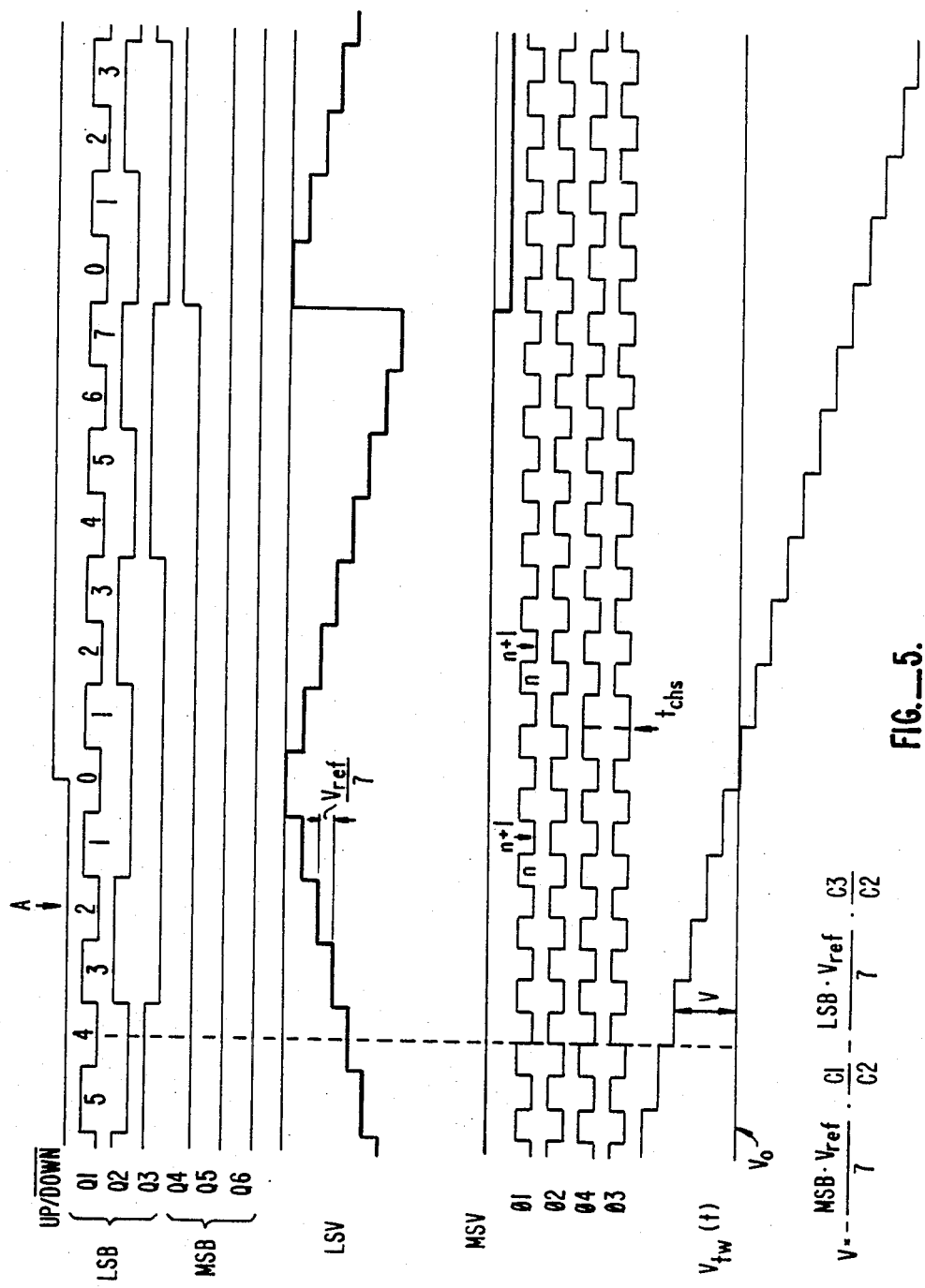
FIG._5.

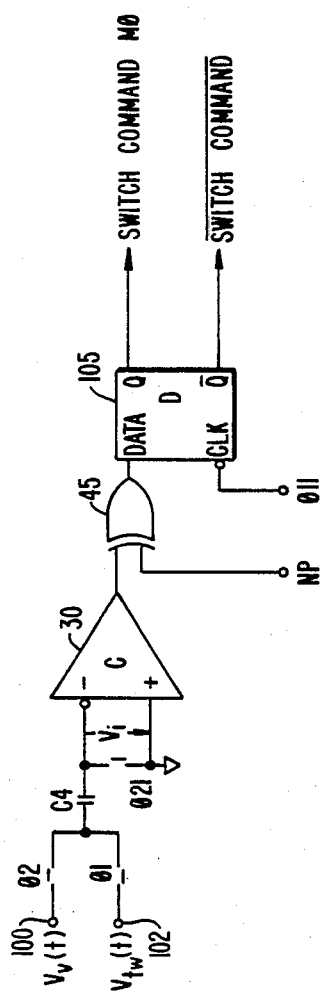
FIG._6.
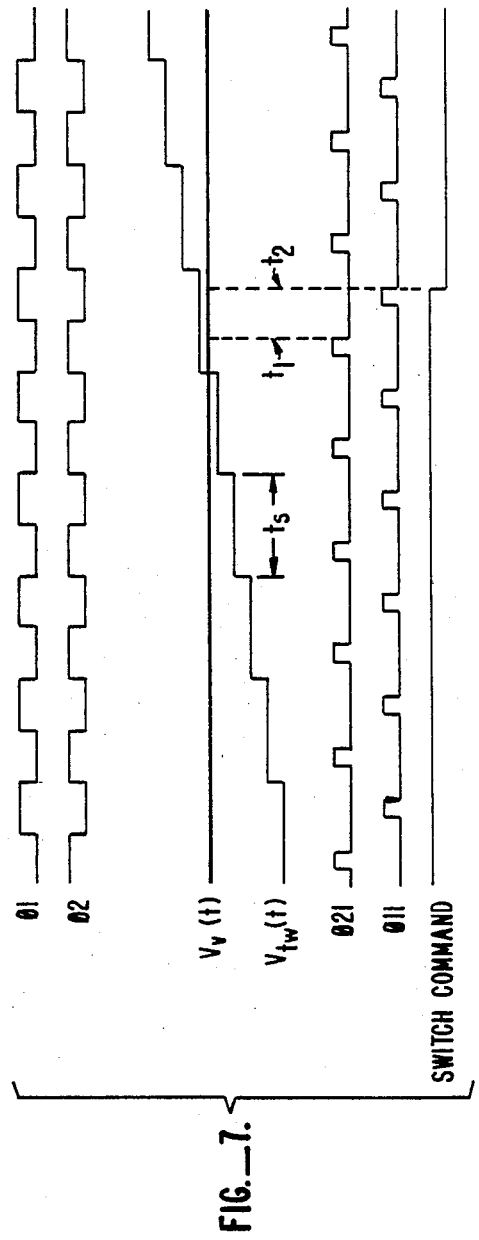
FIG._7.

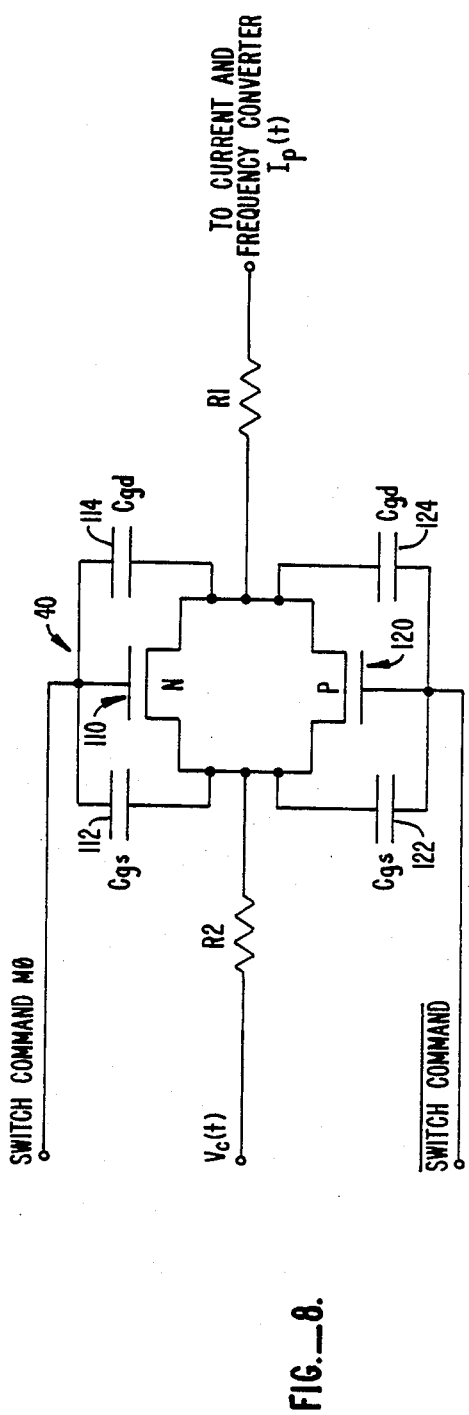
FIG._8.
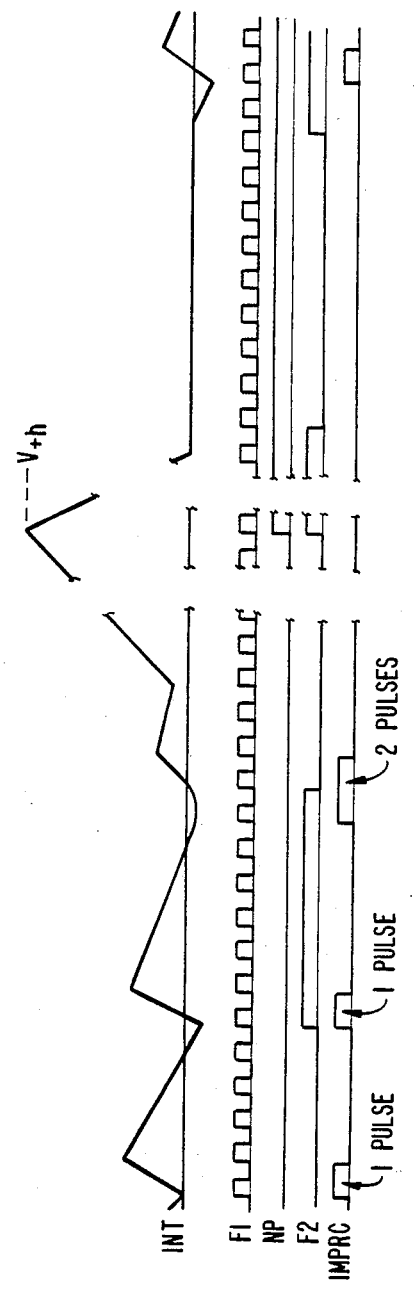
FIG._10.

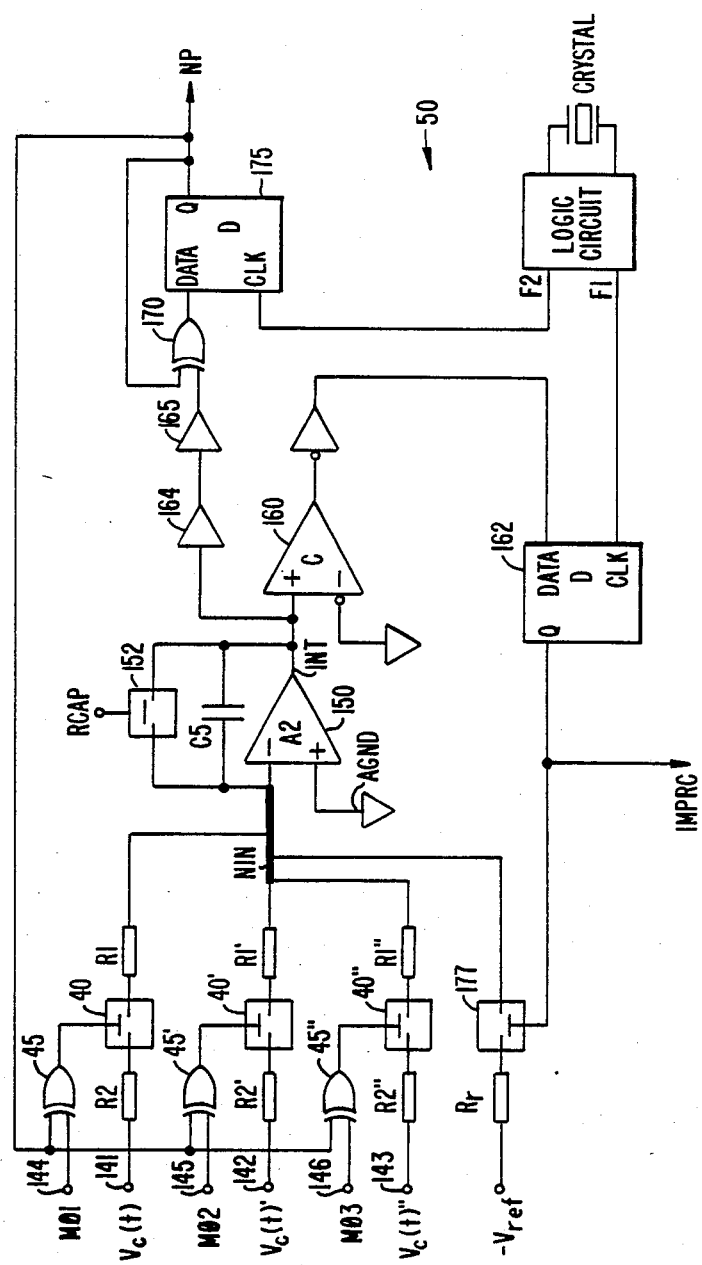
FIG.—9.

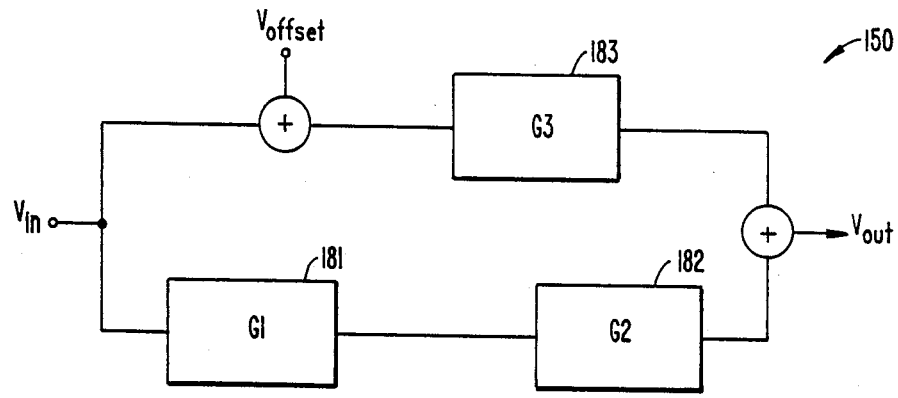
FIG._11.
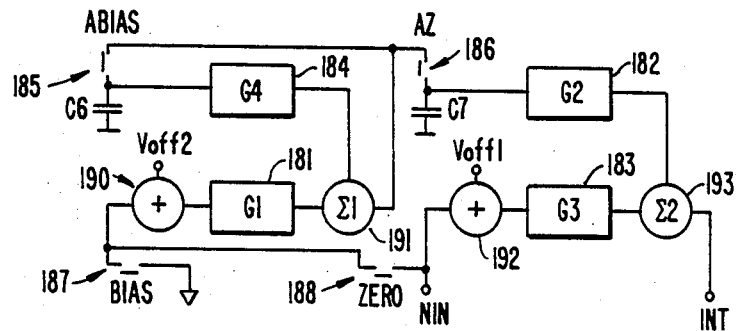
FIG._12.
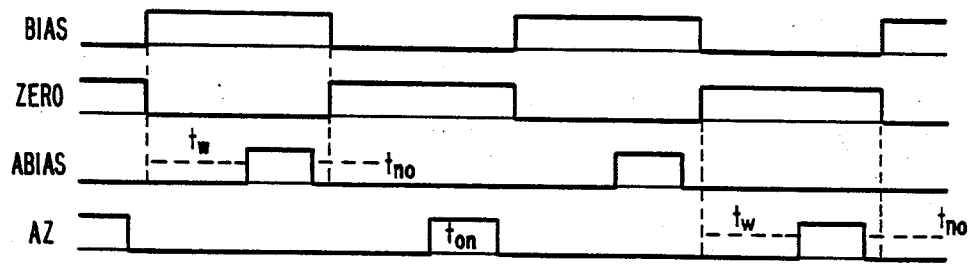
FIG._13.

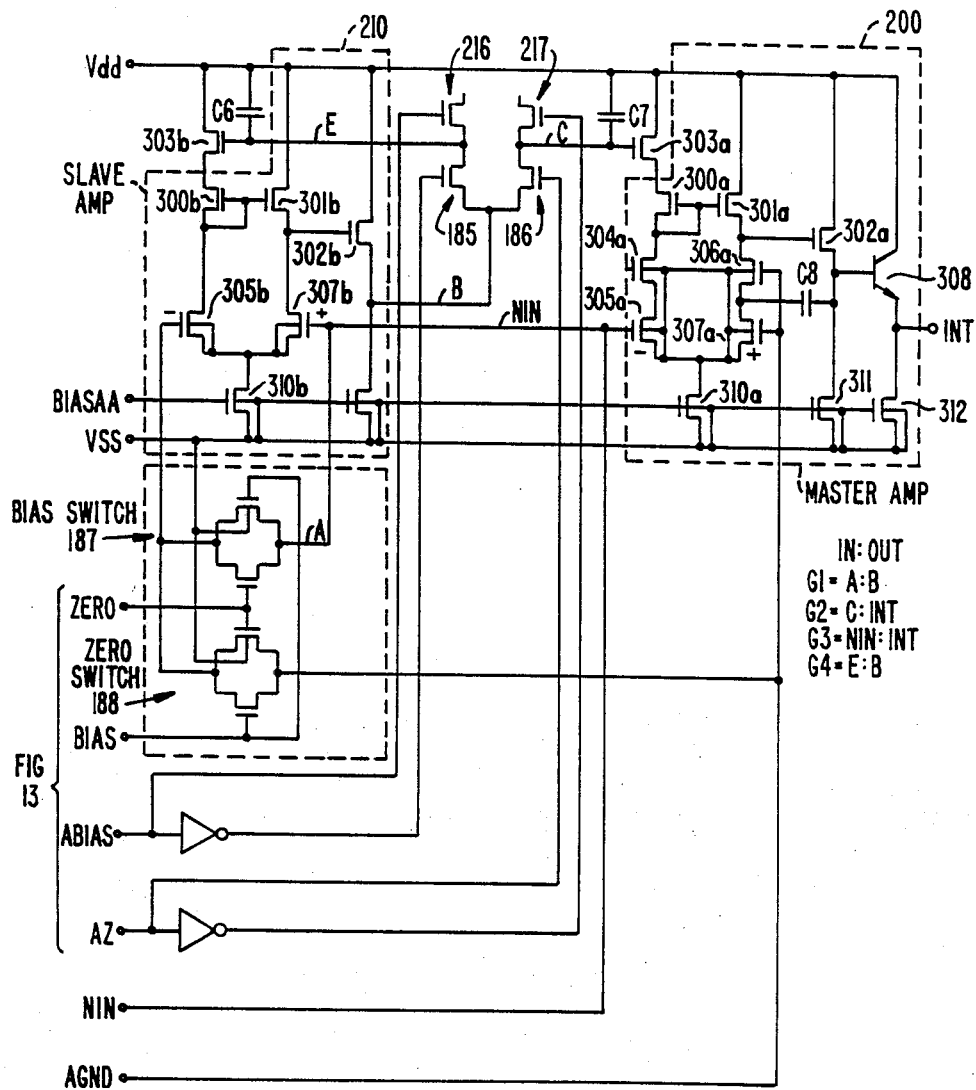
FIG._14.

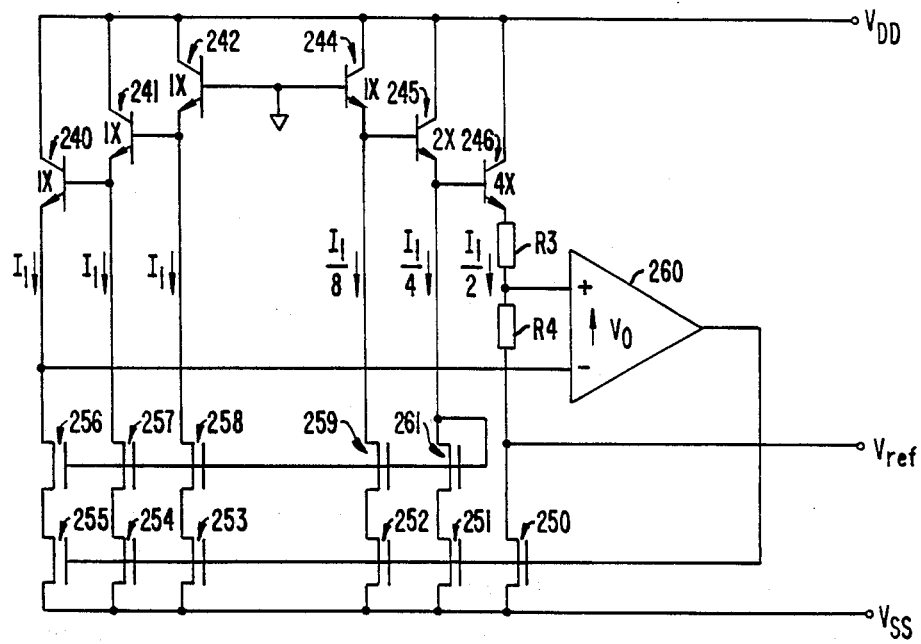
$$V_{ref} = -V_{BE244-6} + \frac{R3+R4}{R3}[(V_{BE244-6} - V_{BE240-2}) + V_0]$$
FIG._15.

AMPLIFIER FOR VOLTAGE OR CURRENT TO FREQUENCY CONVERTER

BACKGROUND OF THE INVENTION

1. Field of the Invention

This invention relates to apparatus for measuring electrical power consumed by an application or supplied by a source. More particularly, the invention relates to an integrated circuit which provides information about electric power in a distribution system when coupled to voltage and current transducers in that distribution system.

2. Description of the Prior Art

Electricity meters are used for measuring the quantity of electric energy consumed or supplied by a particular application. In alternating current supply or distribution systems, electromechanical watt-hour meters typically have been used. Such well know watt-hour meters are used throughout the world to measure the consumption and supply of electricity and are a common fixture on almost any residential or industrial structure to which power is supplied. While such meters are highly reliable, their mechanical construction sharply limits the range of additional functions they may perform. For example, charging different rates at different times of the day or under different utility load conditions is difficult, as is using the meter itself to control a load or a generator. Additionally such mechanical meters would be quite expensive to fabricate were they to perform many of these functions.

Completely electronic meters, but not integrated circuits, for the measurement of power are described in U.S. Pat. Nos. 4,015,140, 4,066,960, and 4,217,546. The techniques therein employ well-known "mark-space amplitude" multiplication or "pulse width-pulse height" multiplication in which the amplitude of a pulse waveform is proportional to one variable and the pulse width is proportional to a second variable. In the case of power metering, if one variable is the potential supplied to or from a load and the other variable is the current flowing to or from a load, then the average value of the waveform is proportional to the power. Generally, the pulse width is determined by a comparator which receives both a triangle waveform and the potential supplied to or from the load.

Unfortunately these techniques suffer from a number of disadvantages which reduce the precision of the meter for low measurement. The multiplier described in these patents injects charge into downstream circuitry which that circuitry incorrectly interprets as a valid signal thereby causing significant errors in the power measurement. The approach shown in the '960 patent relies upon a resistor-capacitor network to provide a frequency source. This is disadvantageous in view of the cost of a sufficiently high quality capacitor. Additionally, at low load conditions, the offset voltage influence of the operational amplifier is not cancelled.

Because of the low cost of manufacture minimal size, and high reliability of solid-state circuits, there have been many attempts to design power meters using integrated circuits. Integrating all of the functions of a power meter onto one or more integrated circuit chips lowers manufacturing cost, and enables the information about power consumption or supply to be used in ways not previously possible. For example. time of day metering wherein a different fee is charged for electricity consumed during peak hours becomes readily feasible if the information from the power meter is used to increment various registers, the particular register depending upon the time of day. Furthermore, the electrical signals from such a meter may be readily transmitted to remote locations for billing or other purposes.

One approach to fabricating a power meter using solid state componentsiis described in PCT International Publication Nos. WO85/00893 and WO85/00894. The system described therein also relies on pulse width-pulse height multiplication performed by a multiplier circuit which produces a signal current proportional to the product of the measured current and voltage. A current-to-frequency converter receives that current and provides an output signal for driving a display.

The multiplier shown in PCT No. '893 has two main disadvantages. The MOSFET switch array associated with the resistor in series with the current path injects a parasitic current proportional to the frequency of a triangular wave signal which has been added to the potential supplied. To reduce this charge injection, the frequency of the triangular wave signal is decreased, unfortunately thereby reducing the multiplier bandwidth. Furthermore, even at such low frequencies an overall charge injection minimization trim is required.

As shown in the No. '894 publication, the offset voltage of an operational amplifier in the current-to-frequency converter is cancelled by opening and closing switches which load the offset voltage onto a capacitor. Unfortunately, during the time the switches are in this configuration, the current-to-frequency converter is disconnected from the circuit and no power is measured. If a power spike should occur during this time, it is not measured. Furthermore, although this technique cancels the offset voltage, it causes charge injection into the measurement circuitry, thereby creating measurement errors.

A more significant disadvantage of this circuitry is that frequencies in the power distribution system may be synchronous with the frequency with which the offset voltage is cancelled. To minimize charge injection into the measurement circuit, the lowest frequency possible is desirable for cancelling the offset. As the frequency of cancellation is reduced, however, the frequency of cancellation becomes integrally divisible into more frequencies appearing in the power distribution system, resulting in errors of several percent in measurement of the electric energy consumed or supplied. Another disadvantage of the circuitry is the requirement for external voltage reference source.

Other known pertinent art is described in an accompanying disclosure statement.

SUMMARY OF THE INVENTION

The system of my invention is adaptable to measure power supplied or consumed by a distribution system in which one or more phases are present. The current and voltage in each phase are sensed by current and voltage transducers or transformers and the resulting signals are supplied to the power meter, which in a preferred embodiment is fabricated on a single integrated circuit. In the meter a sampling voltage comparator receives the signal from the voltage transformer indicative of the potential in the distribution system, together with a highly linear triangular wave signal having a frequency much greater than the frequency of the power distribution system. The comparator supplies an output signal whenever the triangular wave exceeds the input potential.

The output signal from the comparator, together with a signal indicative of whether power is being supplied or consumed, is used to control a CMOS switch. One side of the switch is connected through a selected resistance to the output of the current transducer, while the other side of the switch is connected through an equal resistance to a current-to-frequency converter. When the switch is closed, a current induced by the output potential of the current transducer flows through the switch. The amplitude of the pulses produced by the closing of the switch is proportional to the sensed current, while the duration of the pulses is proportional to the sensed voltage. The average value of each pulse, therefore, is proportional to power, that is, the product of the sensed voltage and current. This power representative current is applied to a current-to-frequency converter which generates pulses. The period of appearance of these pulses is indicative of the mean power consumed or supplied. The number of pulses accumulating in a register over a period of time gives information abut the energy consumed or supplied.

The system includes many unique features. The triangle wave signal generator combines a digital-to-analog converter with a charge transfer circuit to provide a highly linear triangular wave signal having consistent peak-to-peak amplitude. The triangle wave signal generator includes a chain of resistors. A switching network driven by an up-down counter provides two voltages—a most significant voltage and a least significant voltage—by connecting selected ones of the nodes in the resistor chain to a charge transfer network. The charge transfer network supplies an output signal voltage which combines the most and least significant voltages. This triangular wave signal is supplied to the voltage comparator. Importantly, the frequency of the triangular wave is not harmonically related to the frequency in the distribution system. This is assured by the spectral noise of a local oscillator which drives the up/down counter employed in generating the triangular wave signal.

A voltage comparator operating at a very low common mode voltage compares the input voltage from the distribution system with the triangular wave. The comparator output drives a CMOS switch which is designed to reduce parasitic currents. The CMOS switch is connected with equal resistances on opposite sides thereof to cancel charge injection, and to provide an output current closely dependent upon the input potential from the current transformer.

The output current from the CMOS switch for that phase of the distribution system, together with the output currents from similar switches coupled to other phases (if any) of the distribution system, are accumulated at a summing node. This summing node is coupled to an input terminal of a special purpose operational amplifier. As the output potential of the operational amplifier decreases with the accumulation of charge from a reference potential on an integration capacitor connected across the amplifier, an opposite polarity reference charge is used to balance the charge stored in that capacitor. The duration of the signal driving the switch to connect the reference potential to the summing node is proportional to the energy consumed or supplied by the application. The duration of the switch control signal is measured using a crystal oscillator. If the power and the reference potential have the same polarity, however, the output potential of the operational amplifier will increase to a threshold level causing a logic network to provide a feedback signal to change the sign of the current supplied to the summing node.

The operational amplifier coupled to the summing node employs a slave amplifier and special timing signals to cancel any offset voltage which would reduce measurement accuracy. Additionally, a special circuit generates the reference voltage used by the system to allow the reference voltage to be substantially free of temperature fluctuations.

BRIEF DESCRIPTION OF THE DRAWINGS

FIG. 1 is a schematic of a preferred embodiment of a poly-phase power meter illustrating its interconnections with one phase of a power distribution system;

FIG. 2 is a block diagram illustrating the overall pulse width amplitude multiplier circuit of the power meter;

FIG. 3 is a timing diagram illustrating the operation of the circuitry shown in FIG. 2;

FIG. 4 is a circuit schematic of the triangle wave signal generator 35 of FIG. 2;

FIG. 5 is a timing diagram illustrating the operation of the generator of FIG. 4;

FIG. 6 is a schematic of the voltage comparator circuit 30 of FIG. 2:

FIG. 7 is a timing diagram illustrating the operation of the circuit of FIG. 6;

FIG. 8 is a circuit schematic of the switch 40 shown in FIG. 2;

FIG. 9 is a block diagram of three current-voltage multipliers connected to a current-to-frequency converter;

FIG. 10 is a timing diagram illustrating the operation of FIG. 9;

FIG. 11 is a block diagram of the auto-zeroing loop employed in the operational amplifier 150 of FIG. 9;

FIG. 12 is a block diagram illustrating the automatic biasing technique employing in FIG. 9;

FIG. 13 is a timing diagram illustrating the operation of FIG. 12;

FIG. 14 is a circuit schematic of the operational amplifier 150 of FIG. 9; and

FIG. 15 is a circuit schematic of the reference voltage source.

DETAILED DESCRIPTION OF THE PREFERRED EMBODIMENTS

Theory of Operation

FIG. 1 is a block diagram illustrating the interconnection of a power meter 10 to an electrical distribution system 5. Power meter 10 measures the amount of electric energy consumed or supplied (or both consumed and supplied) by a particular application 15. Application 15 typically will be a customer of a utility company such as a residence or business, or a supplier of electrical energy to a utility company, such as an electricity generating plant. Consumers or generators, such as application 15, are connected to the electrical distribution system 5 by one, two or three phases. In FIG. 1, only a single phase is shown, which consists of a pair of conductors of alternating current having a potential U(t) established between them. In embodiments of the invention more than one phase, all phases are connected similarly to meter 10. In other embodiments, each phase is sampled individually and supplied to meter 10 through a multiplexer.

To determine the power consumed or generated by the application 15, it is necessary to determine the product of the current I(t) flowing induced by the voltage U(t). The power P(t) consumed or generated by n phases is:

$$P(t) = \sum_n U_i(t) \cdot I_i(t) \qquad (1)$$

Power meter 10 computes the power-related information by measuring the current I(t) and potential U(t). The potential of the distribution system at the metered location is sensed by employing either a voltage transformer 20, a voltage divider, or mutual transducer. In a similar manner, the current flowing to or from the application 15 is detected using a current transformer 24, mutual inductance transducer, or other well known apparatus.

The voltage transformer or divider 20 delivers a voltage $V_v(t)$ to the power meter 10 which is characterized by the voltage constant $k_v$ of the transducer 20. Similarly, the current transformer 24 delivers a voltage proportional to the current in the phase sensed. The transformer output is characterized by the transformer constant $k_c$ and shunt resistance $R_{sh}$. The power meter 10 is designed with the assumption that the current transducer 24 provides current information having a mean value of zero. (This is not a critical limitation because almost all current transformers and mutual inductance transducers behave in such a manner.) The voltage transformer provides voltage information $V_v(t)$ proportional to the voltage difference between the phase sensed and the neutral line or between the phase sensed and another phase as given by Equation 2 below, while the current transformer 24 provides voltage information $V_c(t)$ proportional to the current in the phase as given by Equation 3 below.

$$V_v(t) = k_v \cdot U(t) \qquad (2)$$

$$V_c(t) = k_c \cdot R_{sh} \cdot I(t) \qquad (3)$$

Power meter 10 then effectively multiplies $V_c(t)$ by $V_v(t)$ to obtain an electric signal $V_p(t)$ which is proportional to the power. This relationship is shown in Equation 4 below.

$$V_p(t) = k_v \cdot k_c \cdot R_{sh} \cdot U(t) \cdot I(t) \qquad (4)$$

The power information then may be converted to frequency information $F_p(t)$ by multiplying by a constant $k_p$.

$$F_p(t) = k_p V_p(t) \qquad (5)$$

By integrating the frequency information over time T, the mean value $F_m$ then is:

$$F_m = \frac{1}{T} \int_0^T F_p(t) dt \qquad (6)$$

while the number of pulses N is:

$$N = F_m \cdot T \qquad (7)$$

Thus the number of pulses, counted over a period of time T at the output of the power meter, is proportional to the energy consumed or supplied.

Power Meter 10 System Overview

FIG. 2 is a block diagram of the power meter 10. As shown in FIG. 2, the power meter receives potential information $V_v(t)$ on line 27 and current information $V_c(t)$ on line 29. The system includes a voltage comparator 30 for comparing the potential information on line 27 with a signal from a triangle wave signal generator 35 on line 32. Although theoretically the voltage transducers may be reversed with the current transformer coupled to the voltage comparator, it is preferred to drive line 27 with the voltage information in view of its dynamic range and the character of the triangular wave. Furthermore, driving line 29 with the current transformer is advantageous because the resistor-current switch-resistor system (R2, 40, R1) is highly linear over at least three decades of driving signal range. This enables accurate measurement over the large dynamic range of the current. Even for small currents the output from the current transformer is sufficient to drive the frequency converter 50. Additionally, the output signal $V_c(t)$ is single ended, in contrast with the double-ended or bridged output of the current transformer of the U.S. patents mentioned above.

The output signal from voltage comparator 30, in conjunction with a sign bit signal NP, controls a CMOS switch 40 via an exclusive OR gate 45. The sign bit indicates whether application 15 is consuming or generating power. Switch 40 is connected between resistors R2 and R1. When switch 40 is closed, a current $I_p(t)$ is caused to flow through the switch to a current-to-frequency converter 50 which employs this signal to supply power information. The current-to-frequency converter 50 typically drives a counter or a display on the exterior of meter 10; however, the information may also be used for other purposes, such as control of the power consumption or generation of the application 15, for transmission to a remote site for calculating rate information, etc.

The operation of the overall system shown in FIG. 2 may be more readily understood with reference to the timing diagram of FIG. 3. For explanation, the signals $V_v(t)$ and $V_c(t)$ are assumed to be constant over the time period depicted in FIG. 3. (It should be understood, however, that the alternating current in the distribution system 5 means signals $V_v(t)$ and $V_c(t)$ will be constant only for very short time periods.)

The triangle wave signal generator 35 generates a triangular waveform having a rapidly varying potential $V_{tw}(t)$ which oscillates between $-V_{ref}$ and $V_{ref}$. The triangular wave signal has a frequency substantially greater than the frequency of the signal in the distribution system 5. For example, typically the triangular waveform will have a frequency about twenty times higher than the highest expected frequency of the distribution system. Furthermore, as mentioned above, because of the spectral noise of the local oscillator, the triangular waveform frequency cannot be phase locked with the frequency of the signal to be measured. Thus, for a 60 Hz distribution system a triangle waveform frequency of 1000 Hz might be employed. Additionally, the maximum potential $V_{ref}$ of the triangular waveform is set to be higher than the largest potential $V_v(t)$ from the voltage transformer 20 expected to be measured. Although only a triangular waveform is described herein, other equivalent oscillating signal, for example, a sawtooth waveform, may be employed.

As shown by FIG. 2, the triangular waveform is supplied on line 32 to comparator 30. Comparator 30 compares this potential with the signal $V_v(t)$ from the voltage transformer or voltage divider 20, and in response provides an output signal indicative of the relative potentials. This output signal, on line 44, drives one input terminal of an exclusive OR gate 45, while sign bit NP, used to designate whether the application is consuming or supplying energy, drives the other input terminal. The sign bit originates from a circuit within the current to frequency converter 50. If the sign bit is 0, then when the input voltage $V_v(t)$ is greater than the triangle wave signal $V_{tw}(t)$, switch 40 is closed and voltage $V_c(t)$ induces a current through the two resistors R1 and R2. When potential $V_v(t)$ is below the triangle wave signal $V_{tw}(t)$, then switch 40 is open and no current $I_p(t)$ flows to current-to-frequency converter 50. The interaction of the comparator 30 with switch 40 results in a series of pulses, shown in the lower portion of FIG. 3 as signal 47, having an amplitude proportional to $V_c(t)$ and a duration proportional to $V_v(t)$. The shaded area of FIG. 3 corresponds to the mean value $\bar{I}_p$ of the current $I_p(t)$.

In FIG. 3, time $t_1$ corresponds to the time that $V_{tw}(t)$ exceeds $V_v(t)$. Time $t_2$ corresponds to the remaining time during which the triangular waveform is beneath the level of $V_v(t)$, while time $t_x$ corresponds to the time following $t_1$ until the triangular waveform becomes negative. Therefore, the basic relationship of the current-voltage multiplier over the period $t_1 + t_2$ is:

$$t_x = \frac{t_2 - t_1}{4} \quad (8)$$

Assuming the voltage is constant and equal to the peak amplitude $k_v \cdot V_m$, over the period of time $t_1 + t_2$, gives:

$$k_v \cdot V_m = V_{ref}\left[\frac{t_2 - t_1}{t_2 + t_1}\right] \quad (9)$$

Thus, $$\frac{t_2}{t_1 + t_2} = \frac{1}{2}\left[1 + \frac{k_v \cdot V_m}{V_{ref}}\right] \quad (10)$$

$$\frac{t_1}{t_1 + t_2} = \frac{1}{2}\left[1 - \frac{k_v \cdot V_m}{V_{ref}}\right] \quad (11)$$

If Rs is the resistance of the switch 40, in series with R1 and R2, $R = R_s + R_1 + R_2$, and the switch is closed during $t_2$, then the mean value of the power related current $I_p$, assuming that it is flowing to virtual ground, is given by:

$$I_p = \frac{1}{R} \cdot \frac{1}{t_1 + t_2} \int_{t_1}^{t_1 + t_2} V_c(t) dt \quad (12)$$

If the switch is closed during $t_1$, the mean value of the current $I_p(t)$ is $$I_p = \frac{1}{R} \cdot \frac{1}{t_1 + t_2} \int_0^{t_1} V_c(t) dt \quad (13)$$

Assuming the current is constant and equal to the peak amplitude Im, over the period $t_1 + t_2$, combining Equations 10 and 12, gives:

$$R \cdot I_p = \frac{R_{sh} \cdot k_c \cdot I_m}{2} + \frac{k_v \cdot V_m \cdot R_{sh} \cdot k_c \cdot I_m}{2V_{ref}} \quad (14)$$

Combining Equations 11 and 13 gives:

$$R \cdot I_p = \frac{R_{sh} \cdot k_c \cdot I_m}{2} - \frac{k_v \cdot V_m \cdot R_{sh} \cdot k_c \cdot I_m}{2V_{ref}} \quad (15)$$

For sine wave signals over a long period of time T, much longer than $(t_1 + t_2)$, the means current $\xi$ is:

$$\xi = \frac{1}{T}\int_0^T I_p \, dt \quad (16)$$

$$\xi = \pm R_{sh} \cdot k_v \cdot k_c \cdot \frac{V_m \cdot I_m \cdot \cos\phi}{2} \cdot \frac{1}{2 \cdot V_{ref}} \cdot \frac{1}{R} \quad (17)$$

where $V_m$ and $I_m$ are the respective peak amplitudes, while $\phi$ is the phase shift of the current with respect to the voltage. The influence of the first term of Equations 14 and 15 is zero because the mean voltage across the shunt at the secondary of a current transformer is zero.

Thus, for positive power, the mean value of the current $I_p$ will be positive when the sign bit is 0 and negative when the sign bit is 1. For negative power, the mean value of the current $I_p$ will be negative when the sign bit is 0 and positive when the sign bit is 1.

Triangle Wave Signal Generator 35

The triangle wave signal generator 35 shown in block form in FIG. 2 is shown in further detail in FIG. 4. FIG. 5 is a timing diagram of the signals used in FIG. 4. In FIG. 4, the generator includes a digital-to-analog converter shown generally on the left side of the figure, and a charge transfer circuit shown generally on the right side of the figure. The digital-to-analog converter, under control of the up/down counter signals Q1, Q1B, Q2 ... Q6, Q6B provides a pair of voltages, arbitrarily designed MSV and LSV, which cause charge to be stored on different sized capacitors C1 and C3, which charges are then combined by the charge transfer circuit to produce $V_{tw}(t)$—the triangle wave signal.

The converter portion includes a series of cascaded N type MOS transistors 52-79 connected along a resistive ladder having resistors 80-86. By being fabricated in integrated circuit form, the resistances of each of resistors 80-86 may be made almost identical, and if necessary, may be trimmed using a laser or other well known techniques. A potential $V_{ref}$, preferably −3.6 volts, is applied to one terminal of the uppermost resistor 80, while the lowermost terminal of the last resistor in the chain, resistor 86, is connected to ground.

Two pairs of transistors are connected in parallel across each resistor, one pair on the right, most significant voltage side, and one pair on the left, least significant voltage side. For example, transistors 68 and 69 are connected in parallel across resistor 82, as are transistors 60 and 61. Similarly, transistors 61, 62, 69 and 70 are connected in parallel across resistor 83. Alternating transistors in a given column have gates connected to a common source of input signals. Thus, transistors 58, 60, 62 and 64 are connected to operate under control of a control signal Q1. The remaining transistors in that column, that is, transistors 59, 61, 63 and 65 are connected to be controlled by the complement to the control signal Q1, that is, Q1B. Each pair of the innermost columns of transistors, in turn, is connected in a similar manner to another transistor. For example, parallel-connected transistors 60 and 61 are serially connected to transistor 55 controlled by Q2B. Parallel-connected transistors 62 and 63 are serially connected to transistor 56 controlled by Q2. This cascaded arrangement of transistors is continued to a pair of output lines for the most and least significant voltages.

The most significant voltage is so named because capacitor C1 has eight times the capacitance of capacitor C3, and accordingly, the voltage on line MSV has more effect on the output signal $V_{tw}(t)$ than does the voltage on line LSV. Capacitor C2 has a capacitance equal to the sum of the capacitances of capacitors C1 and C3. The MSV and LSV output lines, in turn, are connected to a charge transfer circuit 90, from which the triangle wave output signal $V_{tw}(t)$ originates. As earlier shown by FIG. 2, the triangle wave signal is coupled over line 32 to comparator 30.

The charge transfer network includes three capacitors C1, C2, and C3 which are connected around an operational amplifier 94. This network transfers the weighted electrical charges placed on capacitors C1 and C3. Clock signals $\phi 1$, $\phi 2$, $\phi 3$, and $\phi 4$ control switches so labeled which transfer charge from the two output lines onto the capacitors C1 and C3 and then onto capacitor C2. The switches controlled by these clock signals each are formed by a CMOS structure in which a P channel device is connected in parallel with an N channel device.

The circuit shown in FIG. 4 provides a highly linear triangular wave with consistent peak-to-peak amplitude. For example, by employing a 6-bit plus sign bit converter, the current-voltage multiplier has better than 0.1% voltage linearity. To facilitate testing of the completed converters and enable uniform quality through large numbers of integrated circuits, a digital-to-analog converter, instead of an analog circuit, is employed. The clock generator 93 driving the triangle wave generator is synthesized on the chip. The spectral noise of that clock guarantees that the triangle wave frequency is not locked to the power distribution system frequency.

The up-down counter functions to select a single tap on the resistive ladder, and therefore one of the eight different potentials available, to be supplied as the most significant voltage output from the converter, as well as a single tap and corresponding potential to be supplied as the least significant voltage output of the converter. The most and least significant voltages are weighted by the relative capacitances of capacitors C1 and C3. The circuit is designed such that C1/C2 is 8/9 and C3/C2 is 1/9. These ratios may be achieved with high accuracy by the photolithographic techniques employed in the formation of capacitors in integrated circuit structures. Once the voltages are presented on the output lines, the clock signals controlling the switches transfer charge induced by these potentials onto capacitors C1 and C3, and then in turn, from each of C1 and C3 onto capacitor 2. Because capacitor C1 has eight times the capacitance of capacitor C3, the potential on line MSV as it is switched from tap to tap will define eight large steps in the output signal $V_{tw}$. Within each one of these large steps, the smaller effect of the potential on line LSV, because of the smaller capacitance of C3, will define eight smaller steps within each large step.

Capacitor C2 acts as a feedback loop for the operational amplifier 94. After transients pass, the output current from amplifier 94 will be null. Thus, all of the charge will be stored on capacitor C2, and the voltage at the amplifier output will be a linear combination of the most and least significant voltages.

FIG. 5 shows the interrelationship of the signals supplied to and from the circuit of FIG. 4. Signals Q1 to Q6 are shown but not their complements. The use of these signals to control the converter signals may be most readily understood by an example. Notice that at instant A, Q2 is high and all other counter signals Q1, Q3–Q6 are low. This pattern turns on transistors 53, 56, and 63 (as well as others) on the least significant side and transistors 73, 77 and 79 (as well as others) on the most significant side. Thus, the MSV is connected to ground and the LSV to the tap between resistors 84 and 85. Therefore, the MSV is ground, and the LSV is two small steps below ground ($V_{ref}$ is negative). The level of $V_{tw}$ therefore is the weighted combination of the MSV and LSV in conjunction with the previous step level of $V_{tw}$. By changing the phases of clock signals $\phi 3$ and $\phi 4$ at time $t_{chs}$ as shown in FIG. 5, the waveform $V_{tw}$ is inverted when it reaches 0 to provide a triangular waveform oscillating between positive $V_{ref}$ and negative $V_{ref}$.

For a positive transfer with clock $\phi 3$ equivalent to clock $\phi 1$ and clock $\phi 4$ equivalent to clock $\phi 2$, $V_{tw}$ is negative, and the charge transfer occurs as follows:

$$Q_{C1}(n) = C1 \cdot (MSV - V_{tw}(n)) \qquad (18)$$

$$Q_{C3}(n) = C3 \cdot (LSV - V_{tw}(n))$$

$$Q_{C2}(n) = C2 \cdot (V_{tw}(n) - V_0)$$

where $Q_C(n)$ is the charge on a capacitor during the nth cycle, Cn is the capacitance of capacitor Cn, and $V_0$ is the offset voltage of the operational amplifier.

As soon as the n+1 cycle starts, a charge transfer on capacitor C2 occurs, then the charges on capacitors C1, C2, and C3 are given by:

$$Q_{C1}(n + 1) = -V_0 C1 \qquad (19)$$

$$Q_{C3}(n + 1) = -V_0 C3$$

$$Q_{C2}(n + 1) = Q_{C2}(n) + \Delta Q$$

$$\Delta Q = C3(LSV - V_{tw}(n)) + V_0 C3 + C1(MSV - V_{tw}(n)) + V_0 C1$$

If C1 + C3 = C2, then $$V_{tw}(n + 1) = \frac{Q_{C2}(n + 1)}{C2} + V_0 \qquad (20)$$

$$V_{tw}(n + 1) + LSV \frac{C3}{C2} + MSV \frac{C1}{C2} + V_0$$

Equation 20 shows that the step n+1 is not influenced by the step n.

For a negative transfer with clock $\phi 3$ equivalent to clock $\phi 2$ and clock $\phi 4$ equivalent to clock $\phi 1$, $V_{tw}$ is positive, and the charge transfer is computed similarly, as shown by the equations below.

$$Q_{C1}(n) = C1 \cdot V_{tw}(n) \quad (21)$$

$$Q_{C3}(n) = C3 \cdot V_{tw}(n)$$

$$C_{C2}(n) = C2(V_{tw}(n) - V_0)$$

$$Q_{C1}(n+1) = C1(V_0 - MSV) \quad (22)$$

$$Q_{C3}(n+1) = C3(V_0 - LSV)$$

$$Q_{C2}(n+1) = C2(V_{tw}(n) - V_0) + \Delta Q$$

$$\Delta Q = C3(V_0 - LSV) - C3 \cdot V_{tw}(n) + \quad (23)$$
$$C1(V_0 - MSV) - C1 \cdot V_{tw}(n)$$

$$V_{tw}(n+1) = -LSV\frac{C3}{C2} - MSV\frac{C1}{C2} + V_0 \quad (24)$$

The use of phases $\phi 3$ and $\phi 4$ enables an inverting or noninverting output by controlling the charge transfer to capacitor C2. Because the offset voltage $V_0$ shifts both the positive and negative phase of the triangular wave, the offset voltage of the amplifier does not affect the accuracy of the multiplier. Also, obtaining the negative values from the converter using the same resistive network and the same capacitors as the positive values makes the output signal linear through zero. Thus, although each step in the waveform is related to the reference voltage and the capacitance of capacitors C1, C2 and C3, the steps are not related to the quality of the operational amplifier 94. For this reason, and because of the stability of the clock over any given small number of cycles, the resulting triangular waveform is highly linear. The particular ratios of capacitors C1 and C3 to C2 are related to the number of bits n used in the digital-to-analog converter. In particular:

$$\frac{C3}{C2} = \frac{1}{2^{n/2}+1} \text{ and } \frac{C1}{C2} = \frac{2^{n/2}}{2^{n/2}+1} \quad (25)$$

The triangle wave signal generator 35 is sensitive to the stability of the voltage reference source. If this source drifts, errors will be introduced. In particular, the peak-to-peak consistency of the triangular wave relies upon the stability of the reference voltage. To achieve the desired stability, the reference voltage is generated in the manner described in conjunction with FIG. 15. The reference voltage generator is fabricated on the same integrated circuit as the other circuitry described herein.

FIG. 5 shows the resulting triangular wave signal $V_{tw}(t)$. For a 7-bit converter (6-bits plus sign bit), the wave signal has 252 steps, 63 for each quarter of a period. The peak to peak amplitude of the triangular wave is twice the reference voltage.

Voltage Comparator 30

FIG. 6 is a more detailed schematic of voltage comparator 30, previously show in block form in FIG. 2, as well as the subsequent signal path for generating the switch command signal. FIG. 7 is a timing diagram of the signals used in FIG. 6. The circuit of FIG. 6 compares the output voltage $V_v(t)$ from the voltage transformer 20 with the triangular wave $V_{tw}(t)$ and depending upon the comparison issues a switch command signal to operate the switch 40.

In FIG. 6, signal $V_v(t)$ from voltage transformer 20 is supplied to node 100 while the triangle wave signal $V_{tw}(t)$ is supplied to node 102. Nodes 100 and 102 are switchably connectable to a capacitor C4 by switches controlled with clock signals $\phi 1$ and $\phi 2$, which are the same clock signals used in the triangle wave generator. In this manner, the comparator is synchronized to the triangle wave generator. The other electrode of capacitor C4 is connected to voltage comparator 30, while the other node of comparator 30 is connected to capacitor C4 under control of a clock signal $\phi 21$.

The voltage comparator must function on the full peak-to-peak range of the triangular wave signal. Because standard voltage comparators built in CMOS technology do not have a wide common mode input voltage, comparator 30 is driven to have its output controlled when its input voltage is close to ground.

The additional clock signals shown in FIGS. 6 and 7, that is, $\phi 21$ and $\phi 11$, are so designated because of their relationship to the clock signals $\phi 1$ and $\phi 2$. In particular, $\phi 21$ is on (high) during a short portion of the time when $\phi 2$ is on, and $\phi 11$ is on during a short portion of the time when $\phi 1$ is on. The switches controlled by these signals are closed when the signal supplied is on.

The output terminal of comparator 30 is connected to one input terminal of XOR gate 45, while the sign bit signal NP is supplied to the other input terminal. Gate 45, in turn, drives one input terminal of a D-type flip-flop 105, while the other input terminal of flip-flop 105 is connected to receive signal $\phi 11$. thereby clocking the flip-flop. The output of flip-flop 105 provides the switch command signal $M\phi$, and its complement, to drive CMOS switch 40. Because the clock signal $\phi 11$ driving D-type flip-flop 105 always follows $\phi 1$ by a predetermined amount of time, a mean delay $t_s$ is introduced in the multiplier.

As shown by FIG. 7. $V_v(t)$ is tored on capacitor C4 by closing $\phi 2$ and $\phi 21$. At a slightly later time, $\phi 1$ allows signal $V_{tw}(t)$ to be applied to capacitor C4. The resulting voltage $V_i$ on capacitor C4 is given by:

$$V_i = V_v(t_1) - V_{tw}(t_2) \quad (26)$$

Thus, the comparator output will be determined by the greater of $V_{tw}$ and $V_v$. Thus, if $V_i$ is less than zero (the triangle wave amplitude exceeds the input voltage) and the negative power bit NP is 0, then the switch command will be 0. In contrast, if $V_i$ is greater than zero while NP is 0, then the switch command is 1.

CMOS Switch 40

FIG. 8 is a more detailed schematic of the CMOS switch 40 prevoously shown in block form in FIG. 2. The switch includes a pair of complementary MOS devices 110 and 120 connected to receive the switch command signal and its complement from the D-type flip-flop outputs in FIG. 6. The N and P channel devices 110, 120, are connected in parallel to control the supply of potential from the current transformer 24 to the current to frequency converter 50 (shown in FIG. 2). The CMOS devices are designed with geometries such that the equivalent conductance of the switch is symmetrical around zero. The complementary devices make the switch highly linear, that is, having uniform characteristics regardless of the polarity of the applied potential $V_c(t)$ The CMOS switch 40 provides no output signal when open and yet provides a current $I_p(t)$ related to the applied potential $V_c(t)$ when the switch is closed.

In FIG. 8 resistors R1 and R2 are show n, as are the parasitic gate/source and gate/drain capacitances associated with each of the N and P channel devices. Three major sources of parasitic current have been minimized in the switch 40 depicted. These are currents in the parasitic capacitors generated by the clocked switch command signal applied to the transistor gates, current due to the change in the gate-channel capacitance and current from the reverse biased diodes of the P and N channel transistors.

The equivalent resistance of the switch in series with the polysilicon resistors R1 and R2 is designed to be constant over the dynamic range of the input voltage $V_c(t)$ Charge injection is minimized and the linearity of the equivalent resistance around zero optimized when the geometry factor W/L of the P and N channel MOS transistors satisfy the equation below, where w is the width. L is the length, $\mu$ is the mobility and $C_{Ox}$ is the capacitance per unit area of the dielectric.

$$\left(\frac{w}{L}\right)_p \cdot \mu_p \cdot C_{0x} = \left(\frac{w}{L}\right)_n \cdot \mu_n \cdot C_{0x} \qquad (27)$$

In the preferred embodiment R1 and R2 each will be about 5000 ohms, while the series resistance Rs of the switch will be about 100 ohms. Charge injection caused by capacitive coupling between the pulsed signal driving switch 40 and the output of the switch is eliminated and current injection minimized by evenly dividing the resistance between resistors R1 and R2. Without this care in the design of the switch 40 power measurement errors would be considerably greater than permissible.

The current $I_p(t)$ from the switch is related to the power consumed or generated in the distribution system. How this current is converted to a signal which varies in frequency according to the power measured is described below.

Charge-Balanced Converter 50

One voltage-current multiplier circuit described above is used for each phase in the distribution system. FIG. 9 is a schematic of the charge-balanced converter 50 for converting current from one or more of the multipliers to a frequency signal. For illustration the system shown in FIG. 9 assumes a three-phase system with three multipliers; however, it will be apparent that as many or as few phases as desired may be metered. FIG. 10 is a timing diagram of the signals used in FIG. 9. In FIG. 9, the converter 50 is shown as receiving signals from three phases. The output voltages $V_c(t)$ from the current transformers for each of the three phases are applied to nodes 141. 142, and 143. The switch command signals M$\phi$1, M$\phi$2, and M$\phi$3 are supplied to terminals 144, 145, and 146. As previously explained, the switch command signals are exclusively ORed with the negative power signal NP by gates 45 to control switches 40 associated with corresponding phases. The output signals from the switches then are summed at a node NIN. A fourth switch 177 coupled to a reference potential $-V_{ref}$ through resistance $R_r$ is connected in parallel with the three phase switches. As will be explained further below, current from the reference switch 177 is used to balance current from the phase switches.

The three switches 40 for the currents from the phases, and one switch 177 for the reference potential, are all matched by being fabricated using ratioed geometries. By fabricating all the CMOS switches and associated resistors in close proximity on the integrated circuit die, the temperature effect are compensated, because temperature will have the same effect on the resistance $R_r$ associated with switch 177 as on the other resistors. Additionally, drift due to long-term temperature instability of all of the resistors will vary in the same manner, again effectively cancelling each other.

For the phase current inputs the resistances are $R1+R2+R_s$ while for the reference voltage the resistances are resistor $R_r$ and switch resistance $R_{rs}$ where:

$$\frac{R_r}{R1+R2} = \frac{R_{rs}}{R_s} \qquad (28)$$

Only a single resistor $R_r$ is used with switch 177 instead of the pair of resistors used with the other switches. This allows all of the switches to operate at around zero volts and minimizes the CMOS "body" effect. The charge injection influence of switch 177 is proportional to the load. At full load this charge injection, about 5 nanoamps, is much lower than the reset current $V_{ref}/(R_r+R_{rs})$, about 200 microamps.

Summing node NIN is connected to the inverting input of a special purpose operational amplifier 150, while the noninverting input of amplifier 150 is grounded. A capacitor C5 is coupled across the amplifier 150, as is a switch 152 which operates under control of a reset capacitor signal RCAP. The output terminal INT of amplifier 150 is connected to an input terminal of voltage comparator 160 which in turn controls a D-type flip-flop 162. The other input terminal of flip-flop 162 is connected to receive a very stable highly precise clcck signal F1 from a crystal controlled oscillator. The output terminal INT of the operational amplifier 150 also is connected through level detectors 164 and 165 to one input terminal of the XOR gate 170. The output of XOR gate, together with signal F2, also derived from the crystal controlled oscillator, control another D-type flip-flop 175 to deliver the negative power sign bit signal NP.

The circuit in FIG. 9 operates as follows. The voltage controlled current from each of the measured phases is delivered to summing node NIN, where it is integrated by the capacitor C5 (switch 152 is open). As charge accumulates on capacitor C5, the output signal from the operational amplifier 150 decreases. At about zero volts, comparator 160 will drive flip-flop 162, which at the next clock signal F1, provides signal IMPRC to close switch 177. Switch 177 connect s reference voltage $-V_{ref}$ to summing node NIN, thereby supplying a calibrated negative current which balances the effect of the positive currents from the phases on capacitor C5. Therefore, charge is removed from the capacitor C5. As the potential on node INT increases, the comparator 160 is deactivated and the reference potential is disconnected. Current from the phase switches, then causes charge to be again stored on capacitor C5 to repeat the process. The pulses in the IMPRC signal in FIG. 10 show how this process is repeated whenever the potential of the summing node NIN reaches the appropriate level.

The above process functions satisfactorily unless the sign of the current from the phases being measured and the sign of the current from $-V_{ref}$ are the same. In this case the charge supplied to node NIN will not balance, and more and more charge will be accumulated by capacitor C5. Eventually, the operational amplifier 150 output voltage will reach $V_{th}$ (see FIG. 10) which is about 3 volts. This threshold voltage is sensed by the level detectors 164, 165, and causes XOR gate 170 at the next clock pulse F2 to drive flip-flop 175 and change the sign of the negative power bit NP. At the same time, other logic, not shown, turns on signal RCAP to reset capacitor C5 and restart the process. Because the sign of bit NP is fed back to the gates 45 controlling the switches 40 associated with the three phases, operation of the comparator 160 will resume with the polarity of the reference current being opposite the polarity of the current from the multipliers.

Over a given period of time, the amount of time signal IMPRC is active is a measure of the energy consumed or supplied. This period of activity is measured with great accuracy by a crystal controlled clock which provides signal F1. If the period of time is T and the number of pulses is N, then:

$$T \cdot \xi = \frac{1}{F1} \cdot \frac{V_{ref}}{(R_r + R_{rs})} \cdot N \quad (29)$$

Solving for N, with $R_{ref} = R_r + R_{rs} = k(R_1 + R_2 + R_s) = k \cdot R$ $$N = \frac{T \cdot \xi \cdot F1 \cdot R_{ref}}{V_{ref}} \quad (30)$$

Substituting from Equation 17:

$$N = \frac{T \cdot F1}{V_{ref}} \cdot \frac{R_{sh} \cdot k_v \cdot V_m \cdot k_c \cdot I_m \cdot \cos\phi}{4 \cdot V_{ref}} \cdot \frac{R_{ref}}{R} \quad (31)$$

or $$N = \frac{T \cdot F1}{V_{ref}} \cdot \frac{R_{sh} \cdot k_v \cdot V_m \cdot k_c \cdot I_m \cdot \cos\phi}{4 \cdot V_{ref}} \cdot k$$

Using K = the product of the constants and $F1 = (1/t_{ref})$:

$$N = T \cdot \frac{K(V_m \cdot I_m \cdot \cos\phi)}{t_{ref} \cdot V_{ref}^2} \quad (32)$$

Therefore, the frequency is $$\frac{N}{T} = \frac{K \cdot V_m \cdot I_m \cdot \cos\phi}{t_{ref} \cdot V_{ref}^2} \quad (33)$$

The output signal IMPRC from the circuit shown in FIG. 9 is a signal having a pulse rate proportional to the sum of the products of the input voltage and current for each of the phases. Thus, for n phases. where i is the phase:

$$F = \frac{1}{t_{ref} \cdot V_{ref}^2} \sum_n K_i \cdot V_{mi} \cdot I_{mi} \cdot \cos\phi \quad (34)$$

This output signal can directly drive a single coil stepping motor for a mechanical digital or analog display of the power consumed by the application. For conventional analog display residential power meters such as employed in the United States, the output pulses will drive an analog mechanism to display the power consumption on a series of dials or drive a digital cyclometer register. If the output pulses are used with an electronic display, the stepping motor output is not used, and the power sign NP indication allows power consumed and supplied to be measured using separate registers, or for the consumption and supply of power to be summed. Additionally, the output signal may be employed in a variety of other applications, for example, by being used to provide feedback into the application consuming or supplying power to regulate it in a desired manner.

FIG. 11 is a block diagram illustrating the function of operational amplifier 150 shown in block form in FIG. 9. In the block diagram of FIG. 11, the operational amplifier 150 includes an input node $V_{in}$, an inherent offset voltage $V_{offset}$, and an output node from which the output voltage $V_{out}$ is supplied. The feedback loop includes feedback of the main operational amplifier 183 having a gain G3, a self-biasing amplifier 181 having a gain G1, and a coupling amplifier 182 having a gain G2. If the self-biasing and coupling amplifiers have different polarization levels by an amount ΔV (mismatching of bias voltages), then when the output voltage on $V_{out}$ is zero, the input voltage on $V_{in}$ is the residual voltage:

$$\Delta V \cdot G2 + V_{in} \cdot G1 \cdot G2 + (V_{in} + V_{offset}) \cdot G3 = V_{out} \quad (35)$$

for $V_{out} = 0$, $V_{in} = V_{residual}$ $$V_{residual} = \frac{V_{offset} \cdot G3 + \Delta V \cdot G2}{G1 \cdot G2 + G3} \quad (36)$$

If G1 and G2 >> G3, then $$V_{residual} = V_{offset} \cdot \frac{G3}{G1 \cdot G2} + \frac{\Delta V}{G1} \approx \frac{\Delta V}{G1} \quad (37)$$

With ΔV ≈ 50 mV and G1 ≈ 50,000, the residual voltage will be less than 1 μV.

To reduce the effect of the offset voltage $V_{off}$ of G1 when G1 is amplifying the residual voltage on NIN, an autobiasing technique is employed, which is shown in more detail in FIG. 12. FIG. 13 is a timing diagram for the signals used in FIG. 12 The circuit of FIG. 12 includes a representation of the gain G3 of the main operational amplifier 183, the gain G2 of the coupling amplifier 182, and the gain G1 of the self-biasing amplifier 181. Gain G4 represents the gain of the coupling amplifier in the slave amplifier. Amplifier 181 is connected to BIAS switch 187, zeroing switch 188, and summing node 191. Amplifier 183 is connected to both the zeroing switch 188 and the input terminal NIN, as well as to a second summing node 193, in turn connected to the output terminal INT. Amplifier 182 is connected between the autozeroing switch 186, capacitor C7, and a summing node 193, while amplifier 184 is connected to the ABIAS switch 185, capacitor C6, and summing node 191.

The operation of the circuit shown in FIG. 12 may be understood with reference to FIG. 13. When the BIAS signal (high) closes switch 187, the input to amplifier 181 will be grounded. A waiting time $t_w$ after closing switch 187 allows discharge of all parasitic capacitances and avoids transferring the wrong bias information to amplifier 184. After the waiting time $t_w$, the ABIAS signal (high), closes switch 185. The loop gains G1 and G4 stabilize the potential $V_{ABIAS}$ on capacitor C6 in such a way that amplifier 181 remains in its linear zone of operation to compensate for $V_{off2}$.

Switch 187 is opened when BIAS goes low. At the same time the ZERO switch 188 closes to allow the input voltage on node NIN to be supplied to amplifier 181. A short time later, signal AZ closes switch 186 completing the feedback loop. The time between the bias signal going low and the closing of switch 186 by signal AZ assures that the voltage held by capacitor C7 is related to the residual offset on node NIN alone and not related to switching noise. During the time signal ABIAS is high, capacitor C6 is loaded with voltage $V_{ABIAS}$. Input NIN then is amplified by G1 to feed capacitor C7 with a voltage $V_{AZ}$ which is amplified by amplifier G2 to provide a correction to node 193 to correct output INT. $V_{AZ}$ is the voltage required on capacitor C7 to reduce $V_{off}$ to $V_{residual}$ through summing node 193.

By fabricating amplifiers G2 and G4 in the same manner with the same geometries and polarization. the $\Delta V$ effect (see Equation 34) is reduced, and an off-set-free system is provided for the main amplifier G3. The structure also compensates for short-term and long-term temperature drift.

FIG. 14 is a detailed circuit schematic of the autozeroing operational amplifier 150 shown in block form in FIG. 9. Amplifier 150 includes a master operational amplifier 200 and a slave operational amplifier 210. The circuit is connected to receive the BIAS. ZERO. ABIAS, and AZ signals described in conjunction with FIG. 13. Transistor 185 is the ABIAS switch, transistor 186 is the AZ switch, while transistors 187 provide the BIAS switch and transistors 188 the ZERO switch. The extra transistors 216 and 217 are dummy transistors to balance charge injection into the capacitors C6 and C7, thereby avoiding any dependence on the frequency of the BIAS signal, approximately 256 Hz.

In the master operational amplifier 200, the transistors have been assigned reference numerals ending with "a", while corresponding transistors in the slave amplifier have reference numerals ending with "b." In the master amplifier transistors 304a and 306a provide a cascode stage, transistors 300a and 301a form the load, while transistor 303a controls the load. Transistors 305a and 307a are a differential pair. Transistor 302a is the output stage with transistor 311 acting as a current source. Transistor 312 provides a current source for biasing the buffer transistor 308. Capacitor C8 provides open loop stabilization.

The master amplifier 200 uses the voltage across capacitor C7 to control the polarization level of transistor 303a, a p-channel MOS device. A p-channel device is employed rather than an n-channel device because of its reduced drift characteristic. In contrast, because of their superior gain, n channel devices are employed for the differential pair 305a and 307a. Changing the polarization level of transistor 303a changes the behavior of the differential pair 305a, 307a, thereby changing the master amplifier's input offset voltage.

To compensate for long term drift, as well as for changes in temperature, it is desirable to change the voltage across capacitor C7 appropriately. This is the function of the slave amplifier 210. The operation of the slave amplifier 210 is similar to the master amplifier 200 in that transistor 303b controls the load 300b, 301b in response to the potential across capacitor C6. The resulting changes in operation of the differential pair 305b, 307b, drive the output stage 302b, which as will be explained, through AZ switch 186 allow changing the potential on capacitor C7 as appropriate.

When the bias switch 187 is closed, the gates of transistors 305b and 307b are shorted together through the switch, and therefore both are connected to receive the potential on node NIN. With the BIAS switch 187 held closed, the autobias (ABIAS) switch 185 is closed (see FIG. 13 for the timing diagram). When this occurs, capacitor C6 is connected to node B, and therefore biased with $V_{BIAS}$. In effect, the potential on capacitor C6 is refreshed periodically.

Switch 185 is then opened, the zero switch 188 is closed and the BIAS switch 187 opened. This connects the gate of transistor 305b to both the gates of transistors 306a and 307a to sense any potential difference with respect to transistor 305b. In effect, transistor 307a drives transistor 305b. When the auto-zeroing switch 186 is closed, node B is connected to capacitor C7 to refresh the voltage on it. Thus, the offset voltage of the master amplifier is reduced to the residual voltage $V_{residual}$.

FIG. 15 is a schematic of the circuit for generating the reference voltage. As described above, the accuracy of the power meter is strongly dependent upon the accuracy of the voltage reference source, e.g., see equation 32. The circuitry depicted is a band-gap voltage source which relies upon the different temperature sensitivity of base-emitter voltage $V_B$ and change in base-emitter voltage $\Delta V_{BE}$ of bipolar transistors. In particular, transistors 245 and 246 are fabricated with a different geometry than transistors 240. 241, 242 and 244. Transistors 240–242 and 244 are one-half the size of transistor 245 and one-fourth the size of transistor 246. Transistor 244 operates on one-eighth the current, transistor 245 on one-fourth the current, and transistor 246 on one-half the current of transistors 240–242. A voltage divider consisting of resistances R3 and R4, but which may also including trimming resistances (not shown), is connected between the emitter of transistor 246 and $V_{ss}$ through transistor 250. An operational amplifier 260 has one input terminal connected between resistors R3 and R4, and the other input terminal connected to the emitter of transistor 240. The output of the operational amplifier 260 is connected to control transistors 250, 251, 252, 253, 254, 255.

The band-gap reference voltage generator shown in FIG. 15 includes stacked transistors 244, 245, and 246 to generate a band-gap which is triple that of a single device. The higher band-gap minimizes the effect of any offset voltage error introduced by the operational amplifier 260. A series of cascode stages 255 and 256. 254 and 257, etc., provide calibrated current sources for the transistors 240, 241, etc.

It is well known that the base-emitter voltage ($V_{BE}$) of a transistor varies substantially with temperature. For example, a typical bipolar device will have a $V_{BE}$ which falls with temperature at about $-2$ millivolts per degree centigrade. Obviously, over the full operating temperature range of the power meter, which encompasses both very cold and very warm ambient temperatures ($-40°$ C. to $+85°$ C.), this variation would produce such large variations in the reference voltage as to destroy the accuracy of the power meter. It is also well known that the change in base-emitter voltage $\Delta V_{BE}$ of two transistors operating at different current densities can have a positive temperature coefficient. The circuit shown combines the two effects to provide a reference voltage which is substantially independent of temperature. The output voltage at terminal $V_{ref}$ may then be buffered and used to provide $V_{ref}$ in FIGS. 4 and 9.

The $V_{BE}$ of transistors 240, 241, 242 is:

$$V_{BE240-2} = 3 \frac{kT}{q} \text{Ln} \frac{I_1}{I_s \cdot A_1} \tag{38}$$

where $I_s$ is the saturation current, $I_1$ the emitter current, and $A_1$ the areas of 240, 241 and 242. The $V_{BE}$ of transistors 244, 245 and 246 is:

$$V_{BE244-6} = 3 \frac{kT}{q} \text{Ln} \frac{I_1}{I_s \cdot 8 \cdot A_1} \tag{39}$$

Therefore the difference is:

$$\Delta V_{BE} = V_{BEleft} - V_{BEright} = \frac{3kT}{q} \text{Ln} 8 \tag{40}$$

$$V_{ref} = -V_{BEright} - \frac{R3 + R4}{R3} (\Delta V_{BE} - V_0) \tag{41}$$

The influence of temperature on kT/q is about 85 μV/°C. and on $V_{BE}$ is about −2 mV/°C. (R3+R4)/R3 is about 11.3.

As has been described, the power meter of my invention provides a highly accurable measure of power consumed or supplied by a distribution system. Although a preferred embodiment of the invention has been explained with reference to specific circuitry, the scope of the invention may be ascertained from the following claims.

I claim:

1. An amplifier comprising:
   a source of reference potential;
   a control transistor having a first electrode coupled to the source of reference potential;
   charge storage means coupled between the reference potential and a control electrode of the control transistor;
   a first load transistor connected to a second electrode of the control transistor and having a control electrode coupled to a second electrode of the first load transistor;
   a second load transistor having a first electrode connected to the reference potential and having a control electrode connected to the control electrode of the first transistor;
   a differential pair of transistors including a fourth transistor having a first electrode coupled to the first load transistor and having a control electrode coupled to an input terminal, and a fifth transistor having a first electrode coupled to a second electrode of the second load transistor and having a control electrode coupled to a second reference potential;
   a current source connected to a second electrode of the fourth transistor and to a second electrode of the fifth transitor for providing current thereto; and
   an output terminal connected to the second electrode of the second load transistor.

2. An amplifier as in claim 1 further comprising a cascode stage coupled between a second electrode of the first load transistor and the first electrode of the fourth transistor, and between a second electrode of the second load transistor and the first electrode of the fifth transistor.

3. An amplifier comprising:
   a master amplifier having a first terminal connected to an input node, a second terminal connected to first charge storage means, and a first output terminal;
   a load connected to the first output terminal;
   a master differential pair of transistors connected to the load, the input node, and to the first output terminal;
   control means for controlling the load in response to a potential across the first charge storage means, the control means being connected to the load and to the first charge storage means; and
   a slave amplifier having a first terminal connected to the input node, a second terminal connected to second charge storage means, and a second output terminal switchably connectable to one of the first and second charge storage means.

4. An amplifier as in claim 3 wherein the control means comprises a control transistor having a first electrode connected to the load and second and third electrodes connected across the first charge storage means.

5. An amplifier as in claim 4 wherein the load comprises a first load transistor connected between a first one of the differential pair and the control means and a second load transistor connected to a reference potential.

6. An amplifier as in claim 5 wherein the third electrode of the control transistor is also connected to the reference potential.

7. An amplifier as in claim 6 further comprising a cascode stage connected between the load and the differential pair.

8. An amplifier as in claim 1 wherein the slave amplifier comprises:
   a second load connected to the second output terminal;
   a second differential pair of transistors connected to the second load, the input node, and to the second output terminal; and
   second control means for controlling the second load in response to a potential across the second charge storage means, the second control means being connected to the second load and to the second charge storage means.

9. An amplifier as in claim 8 wherein the second control means comprises a second control transistor having a first electrode connected to the second load and second and third electrodes connected across the second charge storage means.

10. An amplifier as in claim 9 wherein the load comprises a third load transistor connected between a first one of the second differential pair and the second control means and a fourth load transistor connected to the reference potential.

11. An amplifier as in claim 10 wherein the third electrode of the second control transistor is also connected to the reference potential.

12. An amplifier as in claim 3 wherein:
    the slave amplifier includes a slave differential pair of transistors, a first one of which is connected to the input node; and
    wherein a first one of the master pair is connected to the input node and a second one of the master pair is switchably connectably to a second one of the slave pair.

13. An amplifier as in claim 12 further comprising:
bias switch means for selectively connecting each of the transistors of the slave pair to the other;
abias switch means for selectively connecting the transistors of the slave pair to an intermediate node and to the second charge storage means; and
autozero switch means for selectively connecting the intermediate node to the first charge storage means.

14. An amplifier as in claim 13 wherein:
the abias switch means comprises an abias transistor coupled between the intermediate node and the second charge storage means, the abias transistor having a control electrode connected to receive an abias switch control signal; and
the autozero switch means comprises an autozero transistor coupled between the intermediate node and the first charge storage means, the autozero transistor having a control electrode connected to receive an autozero control signal.

* * * * *